(12) United States Patent
Rivera (10) Patent No.: US 7,019,973 B2
(45) Date of Patent: Mar. 28, 2006

(54) CIRCUIT COOLING APPARATUS

(75) Inventor: Rudy A. Rivera, Aquadilla, PR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 31 days.

(21) Appl. No.: 10/864,165

(22) Filed: Jun. 9, 2004

(65) Prior Publication Data

US 2004/0240184 A1 Dec. 2, 2004

Related U.S. Application Data (62) Division of application No. 10/246,606, filed on Sep. 18, 2002, now abandoned.

(51) Int. Cl.
*H05K 7/20* (2006.01)

(52) U.S. Cl. .................. 361/700; 165/46; 165/80.4; 165/104.33; 174/15.2; 257/715; 257/722; 361/703

(58) Field of Classification Search ............... 165/46, 165/80.4, 104.25, 104.33; 174/15.2; 257/715–716, 257/722; 361/700–703, 719–721, 698–699
See application file for complete search history.

(56) References Cited

U.S. PATENT DOCUMENTS

| | | | | |
|---|---|---|---|---|
| 5,168,348 A | * | 12/1992 | Chu et al. ................. 257/713 |
| 5,661,637 A | * | 8/1997 | Villaume .................. 361/687 |
| 5,829,512 A | * | 11/1998 | August ........................ 165/46 |
| 5,982,616 A | | 11/1999 | Moore | |
| 6,189,601 B1 | | 2/2001 | Goodman et al. | |
| 6,504,720 B1 | * | 1/2003 | Furuya ...................... 361/699 |
| 6,595,270 B1 | * | 7/2003 | Machiroutu et al. ... 165/104.26 |

FOREIGN PATENT DOCUMENTS

| | | |
|---|---|---|
| EP | 0348 838 | 1/1990 |
| GB | 1 526 160 | 9/1978 |
| JP | 58083183 | 5/1983 |
| JP | 9329394 | * 12/1997 |

* cited by examiner

*Primary Examiner*—Gregory Thompson (57) ABSTRACT

Representative embodiments provide for a circuit device cooling apparatus having a first heat pipe which includes a first heat pipe condenser, and a second heat pipe which includes a second heat pipe condenser. A heat sink is attached to the first heat pipe condenser and the second heat pipe condenser. Another representative embodiment provides for a method of removing heat from a first circuit device and a second circuit device. The method includes providing a heat dissipating member, and connecting the first circuit device to the heat dissipating member with a first heat pipe. the method further includes connecting the second circuit device to the heat dissipating member with a second heat pipe, and providing compliance between the first heat pipe and the second heat pipe.

18 Claims, 6 Drawing Sheets

CIRCUIT COOLING APPARATUS

CROSS REFERENCE TO RELATED APPLICATIONS

This application is a divisional application under 35 U.S.C. § 120 of U.S. patent application Ser. No. 10/246,606, filed Sep. 18, 2002, now abandoned which is hereby incorporated by reference herein in its entirety.

BACKGROUND

Electronic circuits, and electronic circuit devices, inherently generate heat when they are being used (i.e., when electrical power is being applied to the circuit or device). This heat can reduce the efficiency of the circuit or device, and in certain instances the heat generated by the circuit or device ("circuit") can be sufficient to damage the circuit, and potentially causing the circuit not to work. It is therefore desirable to find a way to remove this heat from the circuit. Two primary modes of heat removal are used: passive and active. Passive heat removal typically involves the use of heat sinks, which provide a larger surface area for convective transfer of heat away from the circuit. In most passive systems, the heat transfer is by natural convection. Active heat removal typically involves the use of a forced-air system to blow a fluid, such as relatively cool air or a liquid, across the circuit. In many electronic apparatus, such as personal computers, these two types of heat removal methods are combined so that cooling air is forced past a heat sink to thereby provide forced convective heat removal from the heat sink. This latter cooling technique can remove significant quantities of heat from an electronic apparatus.

When cooling a printed circuit assembly ("PCA"), which comprises a printed circuit board ("PCB") on which circuit devices are mounted, it is generally desirable that the cooling air in a forced convection cooling system blows across the PCB in a direction generally parallel to the plane of the PCB. However, it can be difficult to obtain a good flow of air across the PCB due to (1) the boundary layer effect (i.e., the velocity at the surface of the PCB will be zero, and therefore velocities very near the surface will be low), and (2) structures mounted, to the PCB board can block the flow of air across the PCB.

Another shortcoming of prior art solutions for cooling PCAs arises where a PCA includes several circuit devices attached to the PCB. For example, in a computer having two or more microprocessors mounted to a single PCB, each processor would typically be provided with its own heat sink. This increases the cost of the overall unit versus using a single heat sink to cool multiple IC devices. On some other instances, like on PCA designs where IC devices must be relatively close to each other, the individual heat sink approach may even prove to be unfeasible. However, connecting two or more IC devices with a single heat sink can cause severe stress on the devices due to height and coplanarity difference between the devices, plus the net effect of the differential thermal expansion of the materials and structures comprising the devices when they are considered in stacked accumulation. Further, conventional thermal interfaces (for example, grease, phase change, and/or polymers) can effectively address filling slight surface imperfections and small coplanarity tolerances between mating surfaces, but they can not comply to large or variable gaps expected from this type of application.

SUMMARY

One embodiment provides for a circuit device cooling apparatus comprising a first heat pipe which includes a first heat pipe condenser, and a second heat pipe which includes as a second heat pipe condenser. A heat dissipation device (for example, a heat sink) is attached to the first heat pipe condenser and the second heat pipe condenser.

Another embodiment provides for a circuit assembly having a first circuit device and a second circuit device. The circuit assembly further includes a first heat pipe which includes a first heat pipe evaporator, a first heat pipe container, and a first heat pipe condenser. A second heat pipe which includes a second heat pipe evaporator, a second heat pipe container, and a second heat pipe condenser is further included in the circuit assembly, as well as a heat sink. In this embodiment the first heat pipe evaporator is in contact with the first circuit device, the second heat pipe evaporator is in contact with the second circuit device, and the first heat pipe condenser and the second heat pipe condenser are in contact with the heat sink. Further, the first heat pipe container is a flexible body.

Yet another embodiment provides for a method of removing heat from a first circuit device and a second circuit device. The method includes providing a heat dissipating member and connecting the first circuit device to the heat dissipating member with a first heat pipe. The method further includes connecting the second circuit device to the heat dissipating member with a second heat pipe, and providing compliance between the first heat pipe and the second heat pipe.

These and other aspects and embodiments will now be described in detail with reference to the accompanying drawings, wherein:

DETAILED DESCRIPTION

In representative embodiments, the present teachings provide methods and apparatus for cooling multiple circuit devices in a circuit assembly with a common heatsink by means of a flexible heat pipe structure which is intended to reduce coplanarity, z-axis tolerance and coefficient of thermal expansion (CTE) stresses between components. Examples of circuit devices, which can be cooled by methods and apparatus described herein, include microprocessors and other integrated circuits. The methods and apparatus described herein use the conventional heat pipe principle to remove thermal energy ("heat") from the circuit device and convey the removed heat to a common remote location where it can be dissipated. More particularly, the methods and apparatus described herein are based on using one or more heat pipes which have a heat pipe body that is flexible, or compliant. "Flexible" or "compliant" as used herein means that the heat pipe body can linearly expand or contract to respectively increase or decrease the distanced between the condenser and the evaporator of the heat pipe. "Flexible" or "compliant" also means that the heat pipe body can be deformed to allow the orientation of the condenser and evaporator to be varied with respect to one another, as will all be described more fully below with respect to FIGS. 1 through 4. This configuration of using a heat pipe with flexible body allows two or more heat pipes (which can be individually associated with two or more circuit devices) to be connected to a single heat sink. Thus, the IC devices do not necessarily need to have the same form factor, height or coefficient of thermal expansion properties.

A heat pipe is a passive heat transfer device which uses an evaporation/condensation cycle to remove heat from an object. The heat from the object is transferred in the form of the heat of enthalpy used to evaporate a working fluid. Natural convection within the heat pipe transports the evaporated fluid from the point of evaporation (near the source of the heat) to a point removed from the source, where the working fluid condenses, thereby removing the heat of enthalpy from the fluid. The fluid then flows back to the evaporation location and the cycle is repeated. Heat pipes provided very high thermal conductivity, typically many times that of a solid metallic conductor such as copper.

More specifically, a heat pipe is typically (although not always) a closed, evacuated cylindrical vessel or container with the internal walls lined with a capillary structure or wick that is saturated with a working fluid. During manufacture, the container is evacuated, charged with a working fluid, and then sealed. The vapor pressure of the working fluid establishes an initial internal pressure within the heat pipe container. The heat pipe further includes an evaporator, which can be a conductive metallic element connected to one end of the heat pipe container. The heat pipe further includes a condenser, which can also be a conductive metallic element and is typically connected to the heat pipe at an end opposite the end to which the evaporator is connected.

The evaporator can be placed in contact with a heat source, such as the upper surface of an integrated circuit chip. As heat from the source is input at the evaporator, the working fluid (in a liquid state) within the container (and near the evaporator) will vaporize as the initial internal pressure within the container increases. This vaporization of the working fluid creates a pressure gradient in the heat pipe container, which causes the vapor to flow along the pipe to a cooler section where the vapor condenses. During condensation, the working fluid releases its latent heat of vaporization, being the heat removed from the source. The working fluid then returns from the condenser to the evaporator by way of a wick.

The heat pipe container typically comprises a hollow section which is preferably made from heat conductive, heat resistant material such as a metallic material like copper or aluminum, although other materials can be used (such as a heat resistant polymer such as TFE). The container includes a continuous wall which defines the hollow section, and which further defines inner surfaces of the container. The inner surfaces of the container are provided with a wicking material (or "wick") which commonly acts on the principle of capillary forces to return the condensed working fluid from the evaporator to the condenser. Gravitational forces can also help to transport the condensed liquid to the evaporator. Materials commonly used for the wick include porous metal foams and felts which are impregnated with metals such as copper, aluminum, and steel. Different types of wicks are used depending on the application for which the heat pipe is being used. Channels can also be formed in the wick to facilitate gravity flow of the liquid.

In most heat pipes, the container is generally a rigid structure, and is frequently cylindrical in horizontal cross section. However, certain specialized "flexible" heat pipes are known. As described above, "flexible heat pipe" means a heat pipe wherein the orientation of the evaporator and condenser to one another can be varied as a result of forces exerted on the heat pipe. Another expression to describe this configuration is "a compliant heat pipe", by which I mean that there is compliance or "give" between the evaporator and the condenser (so that one can move with respect to the other under the influence of an force, which can be applied externally or internally to the heat pipe). One example of a flexible heat pipe is described in U.S. Pat. No. 4,274,476 to Robert W. Garrett, which is hereby incorporated herein by reference in its entirety. In this example the heat pipe comprises a container that is an expansible bellows, sandwiched between the evaporator and the condenser. An example of this type of flexible heat pipe will be described further below.

Although heat pipes are generally in the shape of an elongated cylinder, generally planar heat pipes are also known. One example of a flexible, generally planar heat pipe is described in U.S. Pat. No. 5,560,423 to Ralph Larson, et al., which is hereby incorporated herein by reference in its entirety. This heat pipe consists of a relatively thin, highly conductive plate as a bottom layer, a plastic sheet as a top layer, and a wicking as an optional middle layer. The bottom plate has a relatively high modulus of elasticity, and is stiff yet ductile. It is preferably made of metal, such as aluminum, or a plastic sheet or plate. This heat pipe can also include heat-dissipating fins on the end (side) of the pipe that operates as the condenser.

Figure 1:
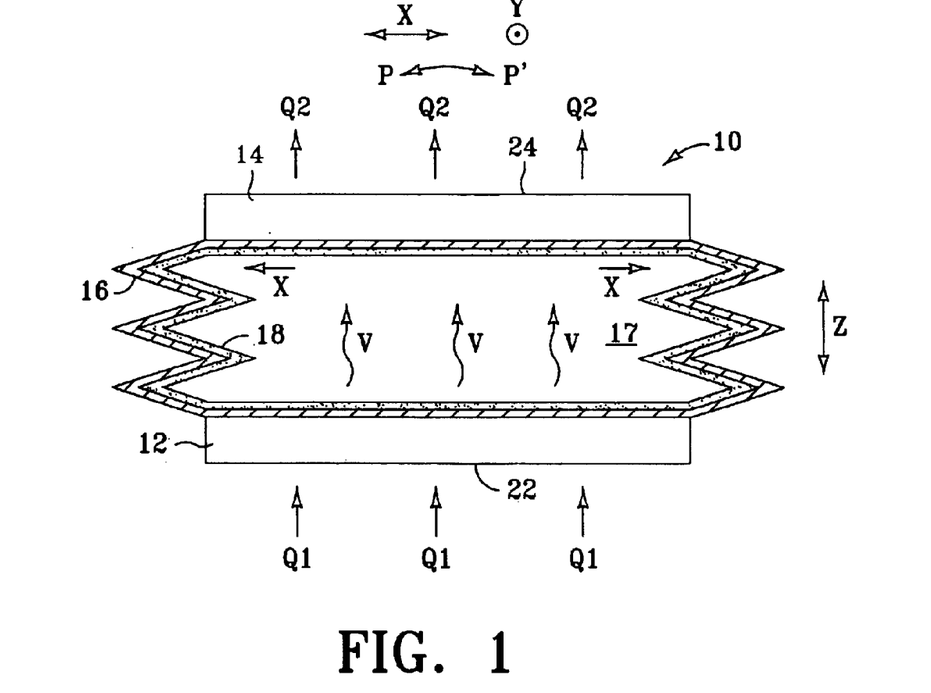
FIG. 1 is a side elevation sectional view depicting a flexible bellows heat pipe.

Turning now to FIG. 1, a side elevation sectional view depicts a flexible bellows heat pipe 10 that can be used in methods and apparatus described herein. The heat pipe 10 is a bellowed heat pipe, and includes an evaporator 12, a condenser 14, and a container 16, which is positioned between the evaporator 12 and the condenser 14. The evaporator 12 and condenser 14 can be flat, conductive metallic plates, for example. The container 16 is an expansible bellows, allowing the evaporator 12 and the condenser 14 to move in the "Z"-axis direction with respect to each other. The expansible bellows 16 also allows a certain amount of rotation of the evaporator 12 and the condenser 14 with respect to one another about the X-axis and/or Y-axis (i.e., in directions "P" and "P'", and directions perpendicular thereto, and combinations thereof). The bellowed container 16 can be fabricated from a metal or a synthetic material which is flexible, temperature resistant, and preferably vacuum proof. The bottom surface 22 of the evaporator 12 is intended to be placed in contact with a heat source,-such as the top surface of an integrated circuit or other circuit device. Heat "Q1" enters the heat pipe 10 at the evaporator 12 and vaporizes the working fluid to vapors "V", which rise in the interior 17 of the heat pipe towards the condenser 14. Heat is removed as "Q2" at the condenser, causing the working fluid to condense. Heat "Q2" can be removed by natural or forced convection, and can be assisted by a heat dissipating device, such as a heat sink. Typically, a thermal interface filler such as thermal grease is placed between the bottom surface 22 of the evaporator 12 and the heat source to aid in transferring heat to the evaporator. Likewise, when a heat sink is placed in contact with the upper surface 24 of the condenser 14, a thermal interface filler is typically placed between the heat sink 10 and the condenser 14 to displace air and facilitate heat transfer to the heat sink 10. A flexible wick 18, such as a felt wick, is in contact with the interior side walls of the bellowed container 16. The wick 18 transports the condensed working fluid from the condenser 14 in the X-Y plane, and back up in the Z- direction toward the evaporator 12.

Figure 2:
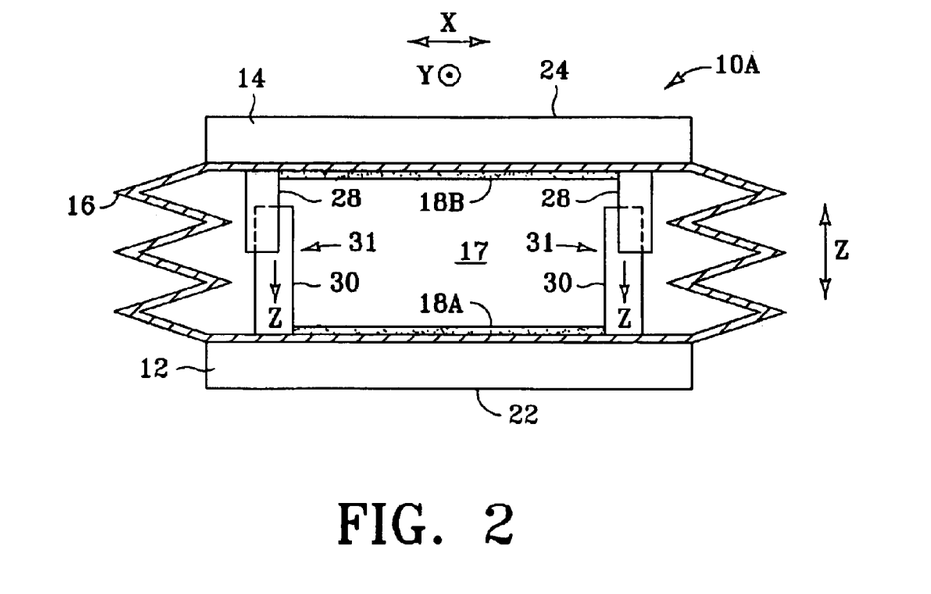
FIG. 2 is a side elevation sectional view depicting another flexible bellows heat pipe.

FIG. 2 is a side elevation sectional view depicting another flexible bellows heat pipe 10A that can be used in methods and apparatus described herein. The heat pipe 10A of FIG. 2 is also a flexible bellowed heat pipe, being similar to the heat pipe 10 of FIG. 1. That is, heat pipe 10 A of FIG. 2 includes an expansible bellows 16 as the container 16, and further includes the evaporator 12 and condenser 14 of heat pipe 10. However, the wick of the bellows 16 of heat pipe 10A includes a first wicking portion 18A attached to the inside surface of the evaporator 12, a second wicking portion 18B attached to the inside surface of the condenser 14, and a two-part side wick section 31. The side wick section 31 comprises an upper wick member 28 and a lower wick member 30 which are slidably engaged to move in the Z-direction thereby allowing the evaporator 12 and condenser 24 to move in the Z-direction as well, with the expansion and contraction of bellows 16.

Figure 3:
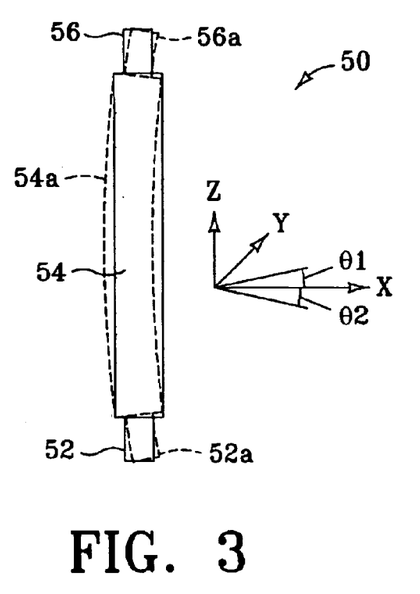
FIG. 3 is a side elevation view depicting another flexible heat pipe.

FIG. 3 is a side elevation view depicting another flexible heat pipe 50 that can be used in methods and apparatus described herein. The heat pipe 50 includes an evaporator 52, a condenser 56, and a container 54, which is placed between the evaporator 52 and the condenser 56. The container 54 includes a flexible body that allows the evaporator 52 and condenser 56 to be slightly rotated to angles θ1 and θ2 from the x-axis, so that they can occupy the positions indicated respectively by dashed lines 52a and 56a. Such rotation of the condenser 56 and the evaporator 52 will be accommodated by compliance of the container 54, which flexes to the position indicated by dashed lines 54a. The flexible container 54 can be fabricated from a heat resistant synthetic material, such as nylon or carbon fiber, and is preferably shaped into a cylindrical form. The container 54 can further include a braided metallic wire mesh (not shown) which can be placed in contact with the inner and/or outer surfaces of the heat resistant synthetic container 54 to provide strength to the walls of the container. A properly selected wire braid can also allow flexure (compression and expansion) of the container 54 along the "Z" axis. Alternate materials can also be used for the container, such as a stainless steel or other metallic tubing. The heat pipe 50 includes an internal wick, described above but not shown in FIG. 3.

Figure 4:
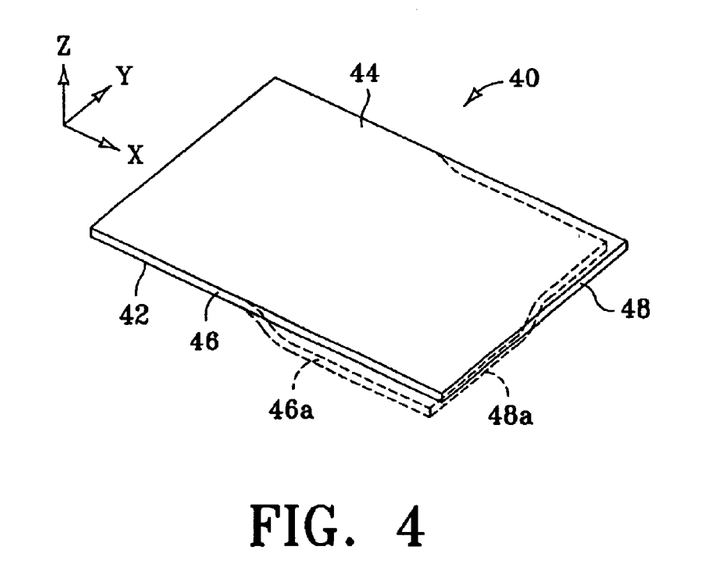
FIG. 4 is an isometric view depicting a generally planar, flexible heat conducting element.

FIG. 4 is an isometric view depicting a generally planar, flexible heat conducting element 40 that can be used in methods and apparatus described herein. The heat conducting element 40 can be a metallic foil fabricated from a heat conducting metal, such as copper, and can also comprise a corrugated metallic foil sandwiched between an upper and a lower metallic foil sheet. Additionally, the flexible heat conducting element 40 can comprise a generally flat heat pipe, as described in U.S. Pat. No. 5,560,423, described above. That is, the flexible heat conducting element 40 can include a bottom sheet 42 which acts as an evaporator and a top sheet 44 which acts as a condenser. A wicking material (not shown) can be placed between the top sheet 44 and the bottom sheet 42. In addition to having the capability of being flexed into a convex or a concave shape, the heat conducting element 40 can be deformed step-wise, as indicated by sides 46 and 48 which are depicted as being deformed to respective positions 46a and 48a.

Figure 5:
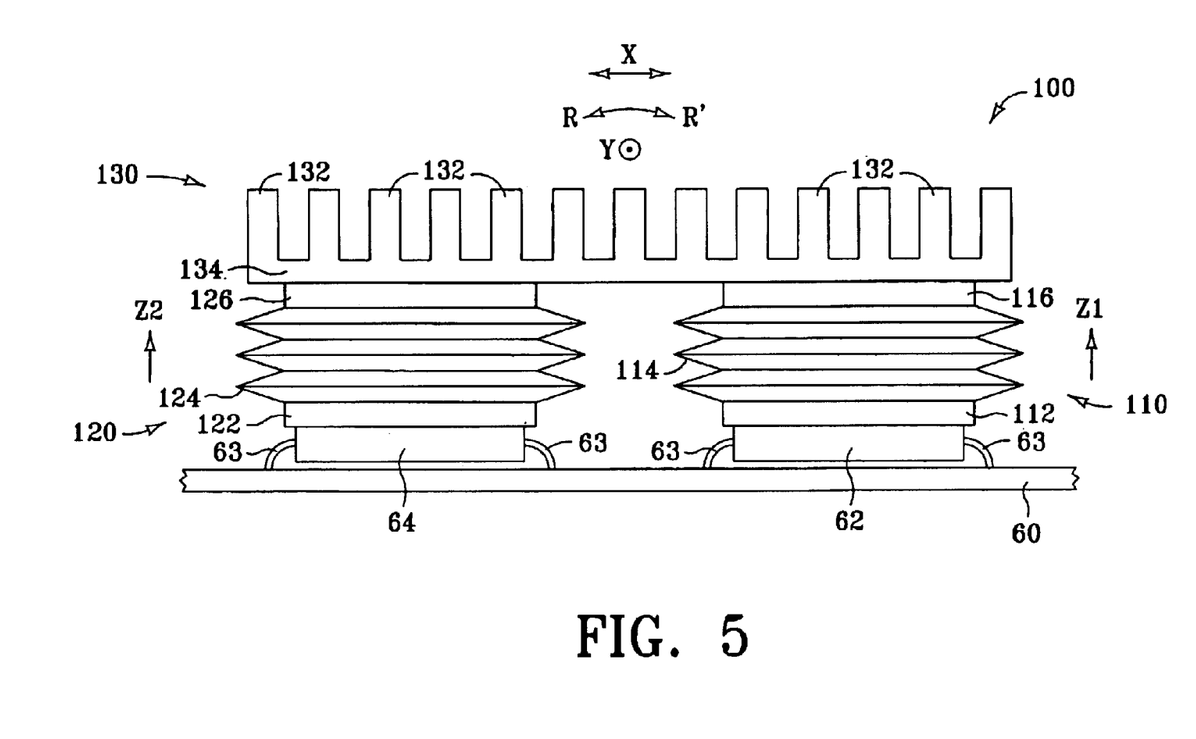
FIG. 5 is a side elevation view depicting a circuit assembly having a circuit cooling device in accordance with one embodiment.

FIG. 5 is a side elevation view depicting a circuit assembly having a circuit cooling device 100 in accordance with a first embodiment. The printed circuit assembly ("PCA") of FIG. 5 includes a circuit board 60 which supports a first circuit device 62 and a second circuit device 64. Circuit devices 62 and 64 can be mounted to the circuit board 60 by metallic feet or pin connectors 63, which are preferably through-hole pin grid array type connectors or surface-mount type (SMT) ball grid array connectors, which are typically soldered to the circuit board. The circuit device cooling apparatus 100 includes a first heat pipe 110 comprising a first heat pipe evaporator 112, a first heat pipe condenser 116, and a first heat pipe container 114. The cooling apparatus 100 further includes a second heat pipe 120 comprising a second heat pipe evaporator 122, a second heat pipe condenser 126, and a second heat pipe container 124. The first heat pipe evaporator 112 is placed in contact with the first circuit device 62, while the second heat pipe evaporator 122 is placed in contact with the second circuit device 64. In this way, heat can be removed from the circuit devices 62 and 64 to the respective heat pipe condensers 116 and 126, in the manner described above with respect to FIG. 1. The cooling apparatus further includes a heat dissipation device 130 which is attached to the first heat pipe condenser 116 and the second heat pipe condenser 126. As depicted, the heat dissipation device 130 comprises a heat sink having heat dissipating fins 132 supported by a main body or base 134 which is in contact with the heat pipe condensers 116 and 126. The heat sink 130 can be fabricated from a conductive metal, such as copper or aluminum.

One or both of the heat pipes 110, 120 can be flexible heat pipes. As depicted in FIG. 5, both the first heat pipe container 114 and the second heat pipe container 124 comprise an expansible bellows, similar to the arrangement depicted in FIGS. 1 and 2 and described above. In addition to using an expansible bellows as depicted in FIG. 5, one of both of the heat pipe containers 114, 124 can comprise a flexible cylinder, such as cylinder 54 depicted in FIG. 3 and described above. As described with respect to FIG. 3, the flexible cylindrical heat pipe container 54 can be a braided metallic cylinder, such as a stainless steel braided mesh cylinder.

Turning back to FIG. 5, the use of the flexible heat pipes 110, 120 will safely compensate any slight inclination or rotation of the heat sink 130 plane with respect to the circuit board 60 plane. Heatsink inclination typically occurs as result of variations in the tolerance stack-up of the heatsink attachment hardware, because of assembly process variations or due to coefficient of thermal expansion (CTE) differences between components that comprise the cooling solution attachment as a whole. Regarding CTE differences, for example, if circuit device 62 generates more heat than circuit device 64, and assuming the heat pipes 110 and 120 are essentially identical in all important aspects (materials of construction, working fluid, exterior dimensions, etc.), then bellows 114 will expand along path "Z1" farther than bellows 124 expands along path "Z2".

Another embodiment provides for a circuit assembly which includes a first circuit device (as device 62 of FIG. 5) and a second circuit device (as device 64 of FIG. 5). The circuit assembly further includes a first heat pipe (such as heat pipe 110 of FIG. 5) which incorporates a first heat pipe evaporator (e.g., evaporator 112), a first heat pipe container (such as container 114 of FIG. 5), and a first heat pipe condenser (such as condenser 116 of FIG. 5). The circuit assembly also includes a second heat pipe (such as heat pipe 120 of FIG. 5) having a second heat pipe evaporator (e.g., evaporator 122), a second heat pipe container (such as container 124 of FIG. 5), and a first heat pipe condenser (such as condenser 126 of FIG. 5). The circuit assembly also includes a heat dissipation device, which can be a heat sink, such as heat sink 130 of FIG. 5. In this arrangement, the first heat pipe evaporator (e.g., 112, FIG. 5) is in contact with the first circuit device (e.g., 62, FIG. 5), the second heat pipe evaporator (e.g., 122, FIG. 5) is in contact with the second circuit device (e.g., 64, FIG. 5). Further, the first heat pipe condenser (116) and the second heat pipe condenser (126) are in contact with the heat sink (130). Preferably, the first heat pipe container (114, FIG. 5) is a flexible body, such as an expansible bellows container 114 depicted in FIG. 5. More preferably, the second heat pipe container (124, FIG. 5) also is a flexible body, such as an expansible bellows container 124 depicted in FIG. 5. In addition to the expansible bellows, a flexible body heat pipe as described with respect to FIG. 3 can also be used to provide compliance (or flexibility) to either or both of the heat pipe containers.

Figure 6:
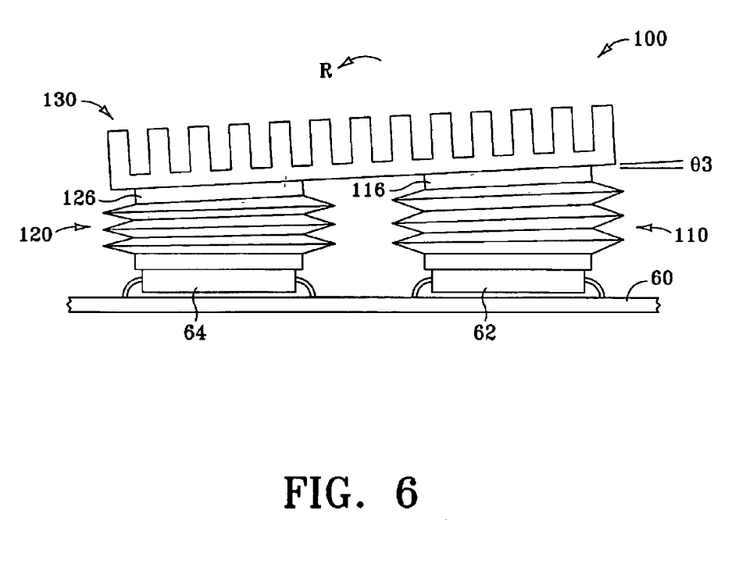
FIG. 6 depicts the circuit cooling device of FIG. 5 in operation.

FIG. 6 depicts the circuit cooling device of FIG. 5 in operation. FIG. 6 shows how the heat sink 130 has rotated by angle θ3 in direction "R". The result is that the heat sink 130 is still in planar contact with the condensers 116, 126 of both respective heat pipes 110, 120. In the absence of the compliance or flexibility of one or both of the heat pipes 110, 120, the forces placed on the heat sink 130 by the differential thermal expansion of the heat pipes 110, 120 can cause the heat sink 130 to become separated from the condenser of at least one of the heat pipes. On the other hand, assuming the heatsink 130 was fixed parallel to PCB 60 by design in FIG. 5, then the flexible heat pipes 110,120 will also compensate for any CTE, height or coplanarity differences between the IC devices 62 and 64. Thus, by using the cooling apparatus 100, a single heat dissipating device (such as heat sink 130) can be used to cool a plurality of heat-generating circuit devices (such as integrated circuits 62 and 64), thereby reducing the potential for stresses on these IC devices and/or on the thermal interface surfaces between the devices and the cooing solution (i.e., at evaporators 112 and 122, and condensers 116 and 126).

Figure 7:
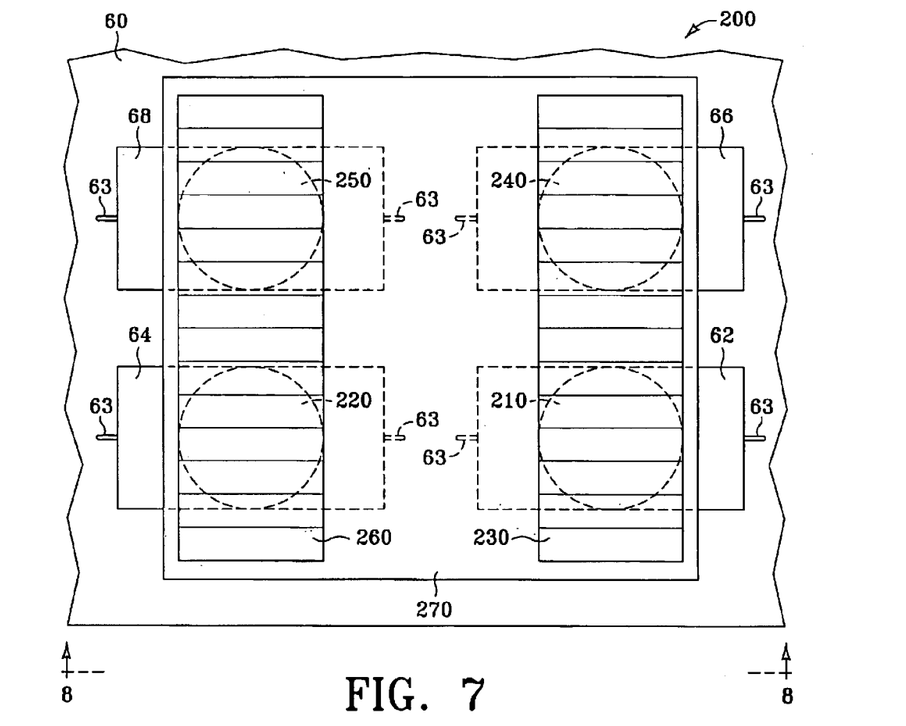
FIG. 7 is a plan view depicting a circuit assembly having a circuit cooling device in accordance with another embodiment.

FIG. 7 is a plan view depicting a circuit assembly having a circuit cooling device 200 in accordance with another embodiment. The printed circuit assembly (PCA) includes a circuit board 60 to which is mounted a first circuit device 62, a second circuit device 64, a third circuit device 66, and a fourth circuit device 68. Circuit devices 62, 64, 66 and 68 can be mounted to the circuit board 60 by metallic feet or pin connectors, such as connectors 63. The circuit device cooling apparatus 200 includes a first heat pipe 210 having a first heat pipe evaporator (not visible in FIG. 7), which is in contact with the first circuit device 62. In like manner, the cooling apparatus 200 includes a second heat pipe 220, a third heat pipe 240, and a fourth heat pipe 250 which have respective second, third and fourth heat pipe evaporators (not shown in FIG. 7) in contact with respective circuit devices 64, 66 and 68. The first, second, third and fourth heat pipes 210, 220 240 and 250 also include respective first, second, third and fourth heat pipe condensers (not shown in FIG. 7) which are separated from the respective evaporators by respective first, second, third and fourth heat pipe containers (i.e., the container of each heat pipe is located between the heat pipe condenser and the heat pipe evaporator). The heat pipe containers are represented by the dashed outlines of heat pipes 210, 220, 240 and 250 which are shown in FIG. 7.

The cooling apparatus 200 further includes a generally planar, flexible heat conducting element 270. The heat conducting element 270 can be in the form of any of the generally planar, flexible heat conducting elements described above with respect to FIG. 4. That is, the flexible heat conducting element 270 can be metallic foil, a built-up metallic foil assembly, or a flat, multi-layer flexible heat pipe as described in U.S. Pat. No. 5,560,423, which was described earlier. The flexible planar heat conducting element 270 is placed over, and in contact with, the condensers of the first, second, third and fourth heat pipes 210, 220, 240 and 250. The cooling apparatus 200 also includes a first heat dissipation device, such as heat sink 230, and a second heat dissipation device, such as heat sink 260. The first heat sink 230 is placed over, and in contact with, the heat conducting element 270 at the first and third heat pipes 210, 240. The second heat sink 260 is placed over, and in contact with, the heat conducting element 270 at the second and fourth heat pipes 220, 250. That is, the flexible heat conducting element 270 is placed between the first (and third) heat pipe condensers (not shown in FIG. 7) and the first heat sink 230, and between the second (and fourth) heat pipe condensers (not shown in FIG. 7) and the second heat sink 260. Preferably, at least one of the heat pipes 210, 240 sharing the common heat sink 230 is a flexible heat pipe. Likewise, at least one of the heat pipes 220, 250 sharing the common heat sink 260 is a flexible heat pipe. More preferably, each of the heat pipes 210, 220, 240 and 250 is a flexible heat pipe.

Figure 8:
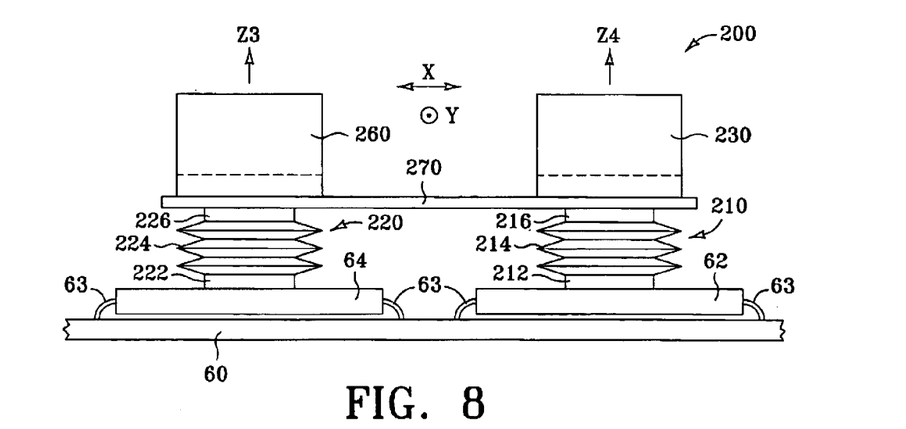
FIG. 8 is a side elevation view depicting the circuit assembly depicted in FIG. 7.

FIG. 8 is a side elevation view depicting the circuit assembly depicted in FIG. 7. FIG. 8 depicts the right side of the printed circuit assembly, and the cooling apparatus 200, of FIG. 7. FIG. 8 shows first and second circuit devices 62 and 64 connected to the circuit board 60. The first circuit device 62 is provided with the first heat pipe 210, which includes first heat pipe evaporator 212, first heat pipe condenser 216, and first heat pipe container 214, which is placed between evaporator 212 and condenser 216. Likewise, the second circuit device 64 is provided with the second heat pipe 220, which includes second heat pipe evaporator 222, second heat pipe condenser 226, and second heat pipe container 224, which is placed between evaporator 222 and condenser 226. As depicted, heat pipe containers 214 and 224 include expansible bellows, much in the manner that heat pipes 110 and 120 of FIG. 5 include expansible bellows containers 114 and 124. Preferably, heat pipes 240 and 250, which are not visible in FIG. 8 because they are located behind respective heat pipes 210 and 220, are also flexible heat pipes, and can also use expansible bellows to provide flexibility. In addition to expansible bellows, the heat pipes 210, 220, 240 and 250 (FIG. 7) can individually (or collectively) use other forms of compliant, flexible heat pipes described herein, such as the flexible heat pipe 50 of FIG. 3, described above.

As can be seen in FIG. 8, the generally planar, flexible heat conducting element 270 is placed over the first and second heat pipe condensers 216 and 226. Further, the first heat sink 230 is place over the heat conducting element 270 at the first circuit device 62, and the second heat sink 260 is place over the heat conducting element 270 at the second circuit device 64. Returning briefly to FIG. 7, it will be appreciated that differential thermal expansion of the first and third heat pipes 210, 240 is accommodated by the flexibility in the heat pipes 210, 240, much in the manner depicted in FIG. 5. This allows heat sink 230 to remain in full contact with the condensers (not shown in FIG. 7) of the heat pipes 210, 240. Similarly, differential thermal expansion of the second and fourth heat pipes 220, 250 is accommodated by the flexibility in the heat pipes 220, 250, allowing heat sink 260 to remain in full contact with the condensers (not shown) of the heat pipes 220, 250. Meanwhile, the flexible heat conducting element 270 accommodates differential thermal expansion between the ganged first and third heat pipes 210, 240, and the ganged second and fourth heat pipes 220, 250. That is, viewing FIG. 8 again, the flexible heat conducting element 270 allows differential movement of heat sink 230 in direction "Z4" relative to movement of heat sink 260 in direction "Z3", resulting in deformation of the heat conducting element 270 in the manner depicted by edge 48 and 48a of FIG. 4.

In one variation on the embodiment depicted in FIGS. 6 and 7, the generally planar flexible heat conducting element 270 can be placed directly on the upper surfaces of the circuit devices 62, 64, 66 and 68, and the heat pipes 210, 220, 240 and 250 can be eliminated. However, in this variation the flexible heat conducting element 270 will be located closer to the circuit board 60 than in the case where heat pipes 210, 220, 240 and 250 are used to space the flexible heat conducting element 270 apart from the circuit devices 62, 64, 66 and 68. Accordingly, this variation can inhibit circulation of cooling air near the circuit board 60.

Figure 9:
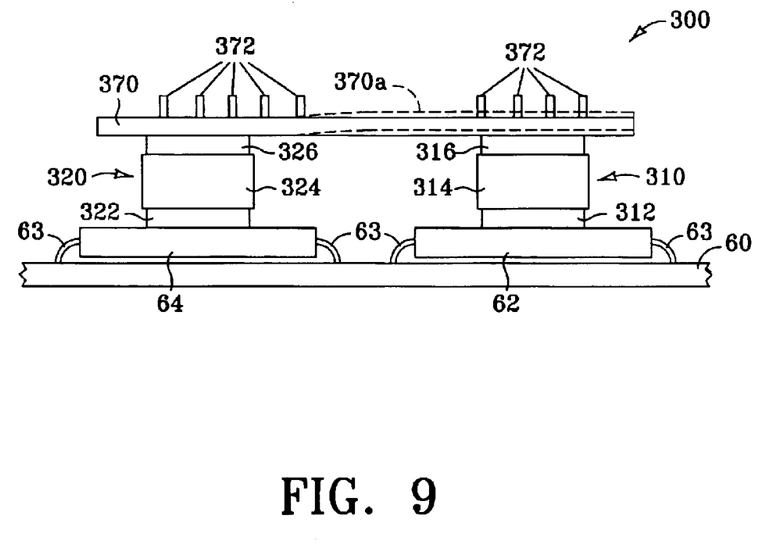
FIG. 9 is a side elevation view depicting a circuit assembly having a circuit device cooling apparatus in accordance with yet another embodiment.

FIG. 9 is a side elevation view depicting a circuit assembly having a circuit device cooling apparatus 300 in accordance with yet another embodiment. FIG. 9 depicts a PCA having a circuit board 60 which supports first circuit device 62 and second circuit device 64 by pins 63. The cooling apparatus 300 includes a first heat pipe 310 which has a first heat pipe evaporator 312 in contact with the first circuit device 62, and a first heat pipe condenser 316. The first heat pipe 310 also includes the first heat pipe container 314, which is placed between the evaporator 312 and the condenser 316. The cooling apparatus 300 further includes a second heat pipe 320 which has a second heat pipe evaporator 322 in contact with the second circuit device 64, and a second heat pipe condenser 326. The second heat pipe 320 also includes the second heat pipe container 324, which is placed between the evaporator 322 and the condenser 326. The circuit device cooling apparatus 300 also includes a generally planar, flexible heat conducting element 370, which can be similar to the generally planar, flexible heat conducting element 270, described above with respect to FIGS. 6 and 7. That is, the heat conducting element 370 can be a metallic foil, a metallic foil composite, or a multi-layer planar heat pipe (as described with respect to FIG. 4). When the heat conducting element 370 is a flexible heat pipe, the cooling apparatus 300 essentially becomes two heat pipes stacked in series (i.e., with heat pipe 310 or 320 acting as the first heat pipe, in the series and heat conducting element 370 acting as the second heat pipe in the series). As shown, the flexible heat conducting element 370 is in contact with first heat pipe condenser 316 and the second heat pipe condenser 326. The use of the generally planar, flexible heat conducting element 370 allows differential thermal expansion of the heat pipe containers 314, 324. For example, in the case where the vertical thermal expansion of heat pipe container 314 is greater than the vertical thermal expansion of heat pipe container 324, heat conducting element 370 will be deformed to the shape indicated by dashed lines as 370a. In this manner, the heat dissipating element (heat conducting element 370) will still remain in full contact with both heat pipe condensers 316, 326, thus providing high levels of heat transfer from both heat pipe condensers 316, 326 to the heat dissipating element 370.

The circuit device cooling apparatus 300 depicted in FIG. 9 differs from the circuit cooling apparatus 200 depicted in FIG. 8 in two primary ways. First, the cooling apparatus 300 of FIG. 9 does not include separate heat dissipating devices, whereas the cooling apparatus 200 of FIG. 8 includes heat dissipating devices (heat sinks) 230 and 260. However, heat dissipating fins 372 can be attached directly to the flexible heat conducting element 370 of the cooling apparatus 300, as depicted in FIG. 9, to further enhance heat removal from the heat conducting element 370. Secondly, the cooling apparatus 300 of FIG. 9 does not show either of the heat pipes 310, 320 as being flexible heat pipes. However, heat pipe 310, and/or heat pipe 320, can be flexible heat pipes, such as the expansible bellows heat pipe described with respect to FIGS. 1 and 2, or the cylindrical flexible heat pipe described with respect to FIG. 3.

As with the embodiment depicted in FIGS. 6 and 7, in one variation of the embodiment depicted in FIG. 9, the generally planar flexible heat conducting element 370 can be placed directly on the upper surfaces of the circuit devices 62 and 64, and the heat pipes 310 and 320 can be eliminated. However, as explained above with respect to a similar variation on the embodiment depicted in FIGS. 6 and 7, this variation can adversely affect the flow of cooling air near the surface of the circuit board 60.

While the methods and apparatus described hereinhave been described as being used to cool circuit devices, it will be appreciated that they can also be used to cool other devices as well. Accordingly, apparatus as generally described herein can be used to cool two devices which are in proximity to one another but which generate differing quantities of heat requiring dissipation. Further, apparatus as generally described herein can be used to cool two devices which are in proximity to one another but which are characterized by different coefficients of thermal expansion from one another, such apparatus can also be used to cool two devices which are in proximity to one another but which are capable of expanding to different lengths as a result of thermal expansion. Examples of the aforementioned types of devices include motors (such as electric motors) and motor components (such as bearings), actuators (such as solenoids), process and laboratory equipment (such as vessels or vials containing fluid), and electrical conductors.

A further embodiment provides for a method of removing heat from a plurality of circuit devices. The method includes placing a first compliant heat pipe (e.g., heat pipe 10 of FIG. 1, 10A of FIG. 2, 50 of FIG. 3, or 110 of FIG. 5) on a first circuit device (such as device 62 of FIG. 5). The method further includes placing a second compliant heat pipe (e.g., heat pipe 10 of FIG. 1, 10A of FIG. 2, 50 of FIG. 3, or 120 of FIG. 5) on a second circuit device (such as device 64 of FIG. 5). The first compliant heat pipe and the second compliant heat pipe are then connected with a heat dissipating member, such as heat sink 130 of FIG. 5.

Yet another method provides for removing heat from a first circuit device (such as device 62 of FIGS. 5, 6 and 9) and a second circuit device (such as device 64 of FIGS. 5, 6 and 9). The method includes providing a heat dissipating member (such as heat sink 130 of FIG. 5, 230 and 260 of FIG. 7, and 270 of FIG. 9). The first circuit device is connected the to the heat dissipating member with a first heat pipe (such as heat pipe 110 of FIG. 5, 210 of FIGS. 6 and 7, or 310 of FIG. 9), and the second circuit device is connected to the heat dissipating member with a second heat pipe (such as heat pipe 120 of FIG. 5, 220 of FIGS. 6 and 7, or 320 of FIG. 9). The method also includes providing compliance between the first heat pipe and the second heat pipe. In one example the compliance between the first heat pipe and the second heat pipe is provided by providing a flexible heat pipe as the first heat pipe. For example, a heat pipe having an expansible bellows, as heat pipe 10 of FIG. 1 or 10A of FIG. 2 can be used. Further, a flexible heat pipe such as heat pipe 50 of FIG. 3 can be used. The compliance between the first heat pipe and the second heat pipe can be further provided by providing a flexible heat pipe as the second heat pipe. In another example, the compliance between the first heat pipe and the second heat pipe can be provided by providing a generally planar, flexible heat conducting element as the heat dissipating member. For example, the generally planar, flexible heat conducting element 40 of FIG. 4 can be used.

While the above methods and apparatus have been described in language more or less specific as to structural and methodical features, it is to be understood, however, that they are not limited to the specific features shown and described, since the means herein disclosed comprise preferred forms of putting the invention into effect. The methods and apparatus are, therefore, claimed in any of, their forms or modifications within the proper scope of the appended claims appropriately interpreted in accordance with the doctrine of equivalents.

I claim:

1. A circuit device cooling apparatus, comprising:
   a first heat pipe comprising a first heat pipe condenser;
   a second heat pipe comprising a second heat pipe condenser;
   a generally planar, flexible heat conducting element; and
   wherein the flexible heat conducting element is in contact with first heat pipe condenser and the second heat pipe condenser.

2. The circuit device cooling apparatus of claim 1, wherein the flexible heat conducting element comprises a metallic foil.

3. The circuit device cooling apparatus of claim 1, wherein the flexible heat conducting element comprises a multi-layer planar heat pipe.

4. The circuit device cooling apparatus of claim 1, and further comprising heat dissipating fins attached to the flexible heat conducting element.

5. The circuit device cooling apparatus of claim 1, wherein the first heat pipe and the second heat pipe are flexible cylindrical heat pipes.

6. The circuit device cooling apparatus of claim 1, and further comprising a first heat sink and a second heat sink; and wherein the flexible heat conducting element is placed between the first heat pipe condenser and the first heat sink, and between the second heat pipe condenser and the second heat sink.

7. The circuit device cooling apparatus of claim 6, and further comprising:
   a third heat pipe comprising a third heat pipe condenser, and wherein the flexible heat conducting element is further placed between the third heat pipe condenser and the first heat sink.

8. The circuit device cooling apparatus of claim 6, wherein the first heat pipe and the second heat pipe are flexible heat pipes.

9. The circuit device cooling apparatus of claim 8, and wherein
   the first heat pipe further comprises a first heat pipe evaporator, and a first heat pipe container located between the first heat pipe condenser and the first heat pipe evaporator;
   the second heat pipe further comprises a second heat pipe evaporator, and a second heat pipe container located between the second heat pipe condenser and the second heat pipe evaporator; and
   the first heat pipe container and the second heat pipe container each comprise an expansible bellows.

10. The circuit device cooling apparatus of claim 7, and further comprising:
    a fourth heat pipe comprising a fourth heat pipe condenser, and wherein the flexible heat conducting element is further placed between the fourth heat pipe condenser and the second heat sink.

11. A method of removing heat from a first circuit device and a second circuit device, comprising:
    providing a heat dissipating member; and
    connecting the first circuit device to the heat dissipating member with a first heat pipe;
    connecting the second circuit device to the heat dissipating member with a second heat pipe; and
    providing compliance between the first heat pipe and the second heat pipe, wherein the compliance between the first heat pipe and the second heat pipe is provided by providing a generally planar, flexible heat conducting element as the heat dissipating member.

12. The method of claim 11, and wherein the compliance between the first heat pipe and the second heat pipe is further provided by providing a flexible heat pipe as the first heat pipe.

13. The method of claim 12, and wherein the compliance between the first heat pipe and the second heat pipe is further provided by providing a flexible heat pipe as the second heat pipe.

14. A circuit assembly, comprising:
    a circuit board:
    a first circuit device and a second circuit device each circuit device being mounted to the circuit board, and each circuit device defining an upper surface;
    a generally planar, flexible heat conducting element in contact with the upper surface of each of the first and second circuit devices;
    a first heat pipe comprising a first heat pipe condenser;
    a second heat pipe comprising a second heat pipe condenser; and
    wherein the flexible heat conducting element is in contact with the first heat pipe condenser and the second heat pipe condenser to thereby place the flexible heat conducting element in contact with the upper surface of each of the first and second circuit devices.

15. The circuit assembly of claim 14, and further comprising:
    a third circuit device mounted to the circuit board, the third circuit device also defining an upper surface;
    a third heat pipe comprising a third heat pipe condenser; and
    wherein the flexible heat conducting element is in contact with third heat pipe condenser to thereby place the flexible heat conducting element in contact with the upper surface of the third circuit device.

16. The circuit assembly of claim 15, and further comprising:
  a fourth circuit device mounted to the circuit board, the fourth circuit device also defining an upper surface;
  a fourth heat pipe comprising a fourth heat pipe condenser; and
  wherein the flexible heat conducting element is in contact with fourth heat pipe condenser to thereby place the flexible heat conducting element in contact with the upper surface of the fourth circuit device.

17. The circuit assembly of claim 14, and wherein the flexible heat conducting element is defined by a lower surface and an opposite upper surface, the lower surface being in contact with the first heat pipe condenser and the second heat pipe condenser, the circuit assembly further comprising a heat sink supported on the upper surface of the flexible heat conducting element.

18. The circuit assembly of claim 16, and wherein the flexible heat conducting element is defined by a lower surface and an opposite upper surface, the lower surface being in contact with the first, second, third and fourth heat pipe condensers, the circuit assembly further comprising:
  a first heat sink supported on the upper surface of the flexible heat conducting element proximate the first and second heat pipe condensers; and
  a second heat sink supported on the upper surface of the flexible heat conducting element proximate the third and fourth heat pipe condensers.

* * * * *

UNITED STATES PATENT AND TRADEMARK OFFICE
CERTIFICATE OF CORRECTION

PATENT NO. : 7,019,973 B2　　　　　　　　　　　　　　　　　　　　　Page 1 of 1
APPLICATION NO. : 10/864165
DATED : March 28, 2006
INVENTOR(S) : Rivera

It is certified that error appears in the above-identified patent and that said Letters Patent is hereby corrected as shown below:

Column 12 line 42 claim 14 delete "board:" and insert --board;-- therefore.

Column 12 line 43 claim 14 after "device" insert --,--.

Signed and Sealed this

Fourteenth Day of April, 2009

JOHN DOLL
*Acting Director of the United States Patent and Trademark Office*